United States Patent [19]

Woodard, Sr. et al.

[11] Patent Number: 4,829,243
[45] Date of Patent: May 9, 1989

[54] ELECTRON BEAM TESTING OF ELECTRONIC COMPONENTS

[75] Inventors: Ollie C. Woodard, Sr., Buda; Andrew W. Ross, Austin, both of Tex.

[73] Assignee: Microelectronics and Computer Technology Corporation, Austin, Tex.

[21] Appl. No.: 157,780

[22] Filed: Feb. 19, 1988

[51] Int. Cl.[4] .................... G01R 31/22; G01R 31/26
[52] U.S. Cl. ........................ 324/158 R; 324/158 D; 324/73 R; 324/71.3; 250/310; 250/311
[58] Field of Search ............ 324/158 R, 158 D, 73 R, 324/71.3, 60 R, 60 CD; 250/310, 311, 397, 305, 306, 307, 492.2

[56] References Cited

U.S. PATENT DOCUMENTS

| | | | |
|---|---|---|---|
| 3,549,999 | 12/1970 | Norton | 324/158 |
| 3,679,896 | 7/1972 | Wardly | 250/305 X |
| 3,694,652 | 9/1972 | Danbury et al. | 250/310 X |
| 3,882,391 | 5/1975 | Liles et al. | 324/158 D X |
| 3,961,190 | 6/1976 | Lukianoff et al. | 250/397 X |
| 4,084,095 | 4/1978 | Wolfe | 250/492.2 |
| 4,169,244 | 9/1979 | Plows | 324/158 |
| 4,179,609 | 12/1979 | Sewell et al. | 250/397 X |
| 4,277,679 | 7/1981 | Feuerbaum | 324/158 D X |
| 4,292,519 | 9/1981 | Feuerbaum | 250/310 |
| 4,697,080 | 9/1987 | King | 250/307 X |
| 4,700,075 | 10/1987 | Kurz et al. | 250/310 X |
| 4,721,910 | 1/1988 | Bokor et al. | 324/158 D |

OTHER PUBLICATIONS

Howitt et al., "Comparison of the Measurement of Beam Current Densities in an Electron Microscope using a Faraday Cup and Solid State Detector"; Journal of Applied Physics; vol. 47, No. 4; Apr. 1976; pp. 1694-1696.

Harting; "A Combined Energy and Angle Analyzer for Scattered Electrons", the Review of Scientific Instruments; vol. 42, No. 8; Aug. 1971; pp. 1151-1156.

*Primary Examiner*—Reinhard J. Eisenzopf
*Assistant Examiner*—Vinh P. Nguyen
*Attorney, Agent, or Firm*—Fulbright & Jaworski

[57] ABSTRACT

An electron beam testing apparatus for applying an electron beam to parts of an electronic component and measuring the secondary electrons released from the part including a secondary electron collector having a plurality of vertically extending screens with a detector positioned adjacent one of the screens. A different voltage is applied to each of the screens of the collector for collecting the secondary electrons over a large area. The apparatus may include a combination blanking and Faraday cup for metering the electron beam current when it is blanked. The apparatus may also be used to measure net work capacitance by measuring the time required to charge a network to a predetermined voltage.

8 Claims, 4 Drawing Sheets

ELECTRON BEAM TESTING OF ELECTRONIC COMPONENTS

BACKGROUND OF THE INVENTION

It is known, as disclosed in U.S. Pat. Nos. 3,549,999, 4,169,244 and 4,292,519 to test an electronic component, such as integrated circuits, with a scanning electron microscope which directs an electron beam in sequence to various points on parts of the electronic components. A current of secondary electrons is emitted in response to the impingement of the electron beam and converted into an electrical signal which is a measurement of values of an electrical parameter at the testing point.

However, most of the prior art apparatus has only had the capability of measuring an area of less than one centimeter because of resolution limitations. In order to measure larger areas of electronic components the components have been required to be moved relative to the beam. See IBM Technical Disclosure Bulletin, Volume 28, No. 8, Jan. 1986. One of the features of the present invention is the provision of a secondary electron collector which can accurately measure secondary electron emission over a large area, without moving the electronic component.

Another problem with prior art devices is that any variations in the beam current adversely affects the measurement results. Another feature of the present invention is the use of a combination blanking and Faraday cup for sampling and measuring the beam current when the beam is blanked thereby achieving better accuracy.

The present invention is also advantageous in that the electron beam may be used to measure the capacitance of networks in the electronic component.

SUMMARY

The present invention is directed to an electron beam testing apparatus for applying an electron beam to part of an electronic component and measuring the secondary electrons released from the part. The apparatus includes means for directing an electron beam onto parts of an electronic component, extraction means positioned above the position of the electronic component, retarding means positioned above the extraction means, and a secondary electron collector positioned above the retarding grid. The collector includes a plurality of vertically extending screens having a top screen providing an enclosure above the retarding grid for receiving the secondary electrons. A secondary electron detection means is positioned adjacent one or more of the vertically extending screens and means are provided for applying different voltages to each of the screens of the collector for collecting secondary electrons efficiently over a large area. The collector includes at least three vertically extending screens and preferably for greater efficiency includes six vertically extending screens. In one embodiment, the detector is connected to and receives secondary electrons through the entire area of one of the vertically extending screens.

Yet a still further object of the present invention is the provision of a combination blanking and Faraday cup which includes a set of blanking plates including a positive and negative plate positioned on opposite sides of the electron beam. The positive plate has an opening for receiving the electron beam when the beam is blanked. A Faraday cup is connected to the opening for receiving the electron beam when it is blanked and directed through the opening. Means are connected to the Faraday cup for measuring the current of the electron beam in the Faraday cup. This provides a means for frequently checking the beam current for achieving greater accuracy of the output measurements.

Still a further object of the present invention is the use of the present invention in measuring the capacitance of a network in the electronic component by providing means connected to the detection means for measuring the time required to charge a network to a predetermined voltage. Because the electron beam is a very high impedance, zero capacitance probe, it can be used to provide a fast, high reliability test as compared to existing capacitance testers which use a single mechanical probe, which inherently includes self-capacitance, to charge each net.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

Figure 1:
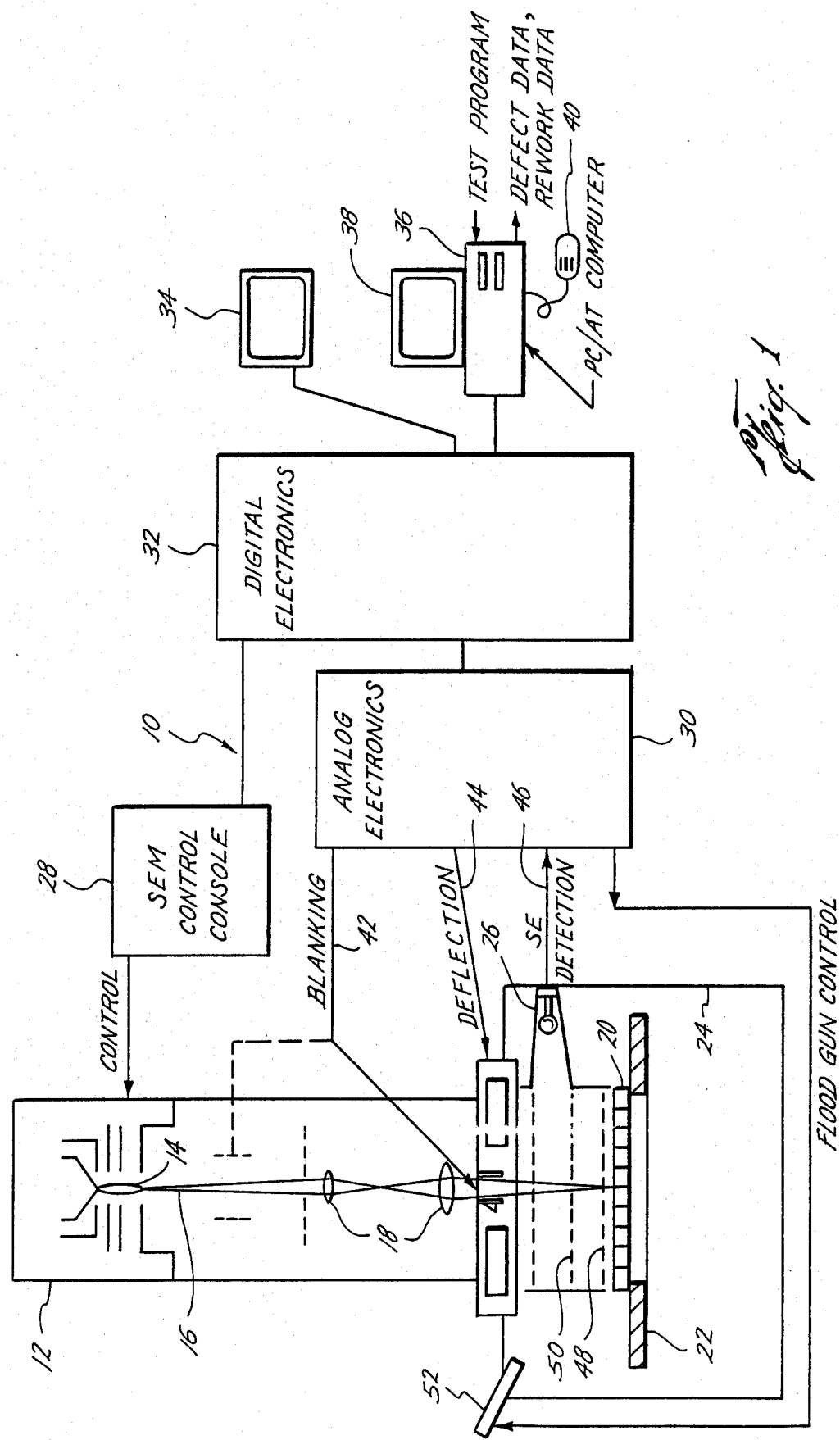
FIG. 1 is an electrical schematic and block diagram of the present invention.

Referring now to the drawings and particularly to FIG. 1, the reference numeral 10 generally indicates the apparatus of the present invention which includes a scanning electron microscope 12 which contains an electron gun 14 for providing an electron beam 16 and an electron-optical system 18 for directing an electron beam onto an electronic component 20, such as an integrated circuit, mounted on a support 22 in a vacuum chamber 24. Detection means 26 measures the secondary electrons released from the component 20 in response to the application of the electron beam 16 to the electronic component 20.

Conventional scanning electron microscope controls 28 are provided along with the analog electronics 30, digital electronics 32, a video monitor 34, a PC/AT computer 36 with a monitor 38, and a control mouse 40. The controls actuate blanking signals 42, and deflection signals 44 for sequentially controlling the electron beam 16 for vectoring it to test various parts of the electronic component 20 and in turn receive secondary emission detection signals 46 for measuring the emitted secondary electrons.

As is conventional, extraction means such as an extraction grid 48 or a magnetic field extraction means is positioned above the electronic component or substrate 20 under tests, for example, 2 mm. When a part or network on the component 20 is probed by the electron beam 16, a positive voltage applied to the extraction grid 48 creates an electrical field which quickly accelerates secondary electrons away from the electronic component 20 minimizing the effects of localized fields from other nearby component parts. Therefore, secondary electrons of all energies pass through the extraction screen 48 where they encounter a decelerating field created by retarding means such as a retarding grid 50, which is negatively charged. Secondary electrons from a negative charged part will be more energetic and overcome the decelerating field and pass through the retard grid 50. Thus, the voltage applied to the retard grid 50 sets the threshold of element charge voltage which will be detected by the secondary electrons collected after passing through the grids 48 and 50. In addition, a conventional flood gun 52 may be provided to flood the electronic component or substrate 20 with electrons of the proper energy to remove negative charges and return all surfaces of the component 20 to near ground potential.

The above description of an electron beam tester is generally conventional. However, prior art equipment has only had aperture capability of a few millimeters and have been used for integrated circuit chip testing for a maximum coverage of one centimeter without the necessity of moving the electronic component 20 relative to the electron beam 16. The present invention is directed to an apparatus 10 which is able to test an electronic component 20 of at least ten centimeters square. To accurately measure voltages over such a large substrate, secondary electrons must be collected with equal efficiency over the tested area. The detection of secondary electrons is a function of their distances from the detector 26.

Figure 3:
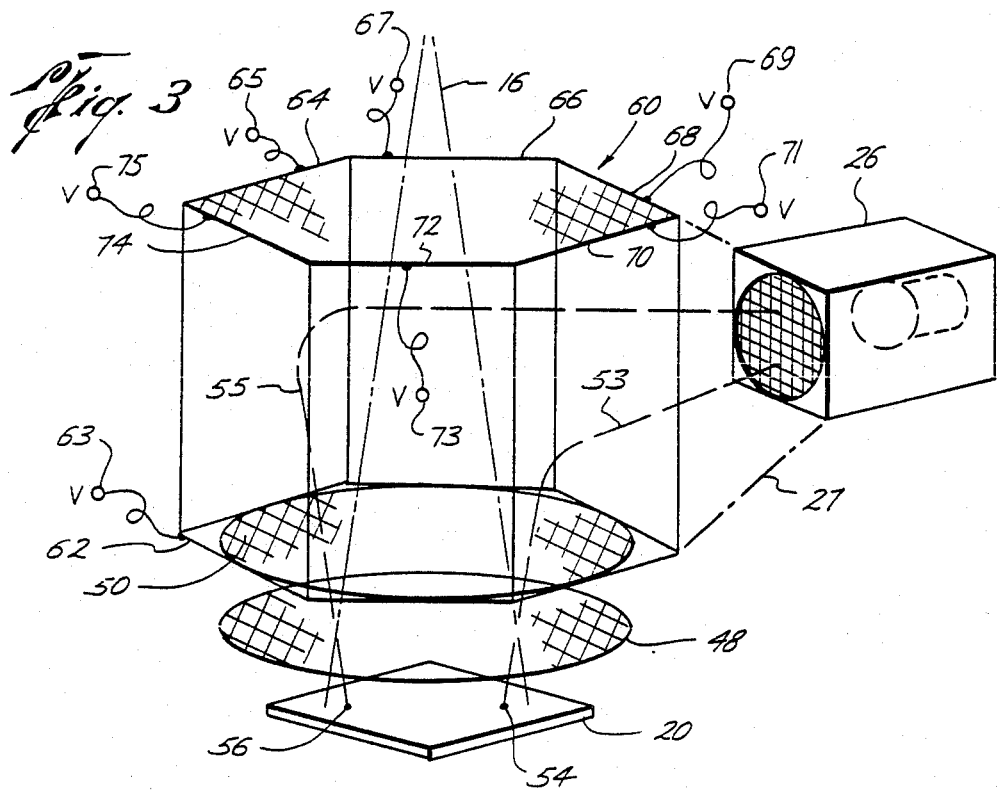
FIG. 3 is a perspective view of the secondary electron collector and detector of the present invention.

Referring now to FIG. 3, it is to be noted that the distance 53 that a secondary electron 54 travels to the detector 26 is different from the distance 55 that a secondary electron 56 travels. both of which are released from the electronic component 20, but at different positions. This is accomplished in the present apparatus 10 by a secondary electron collector generally indicated by the reference numeral 60 which consists of a plurality of vertical screens, here shown as six screens 62, 64, 66, 68, 70, and 72 positioned above the retard screen 50 and together with a top screen 74 to form an enclosure. By adjusting the individual voltages applied to each of the screens 62, 64, 66, 68, 70, 72 and 74 by voltage means 63, 65, 67, 69, 71, 73 and 75, respectively, electric fields will be created in the enclosure which will direct secondary electrons from any point toward the detector 26 which is placed behind one or more of the screens, such as screen 68. Once the proper voltage settings are set for any particular secondary electron emission location, the set voltages will remain constant with respect to the potential of the retard screen 50. Referencing the voltages of the collector 60 to the retard grid supply, allows filter tuning over a range of energy cutoffs with a single voltage. As the electron beam 16 is vectored from point to point on the electronic component 20, the voltages on each of the screens in the collector 60 are set to the optimum for each testing position. While the number of vertical screens shown in the preferred embodiment of FIG. 3 is six, as few as three may be provided if desired. A greater number than six may also be provided for greater efficiency; however, six is the preferred number as a trade-off between efficiency of collection and complexity.

The computer 36 sets up the voltages on each of the screens in the collector 60. For example only to illustrate the generally order of magnitude for one case, the extraction grid 48 may have a positive voltage of 100 volts, the retarding grid 50 may have a negative potential of ten volts, screen 68 may have a positive voltage of 50 volts, screen 62 may have a negative voltage of 50 volts, screens 64 and 72 may have a negative voltage of 30 volts, and screens 66 and 70 may have a negative voltage of ten volts, applied thereto.

The detector means 26 is of a conventional design such as a postively charged scintillator coupled to a photomultiplier tube. However, it is preferred that a light guide 26 cover the entire area of the back of the adjacent screen 68 for receiving all of the secondary electrons passing through the screen 68. Multiple scintillators may also be placed in back of other screens to achieve more collection efficiency and uniformity.

Figure 2:
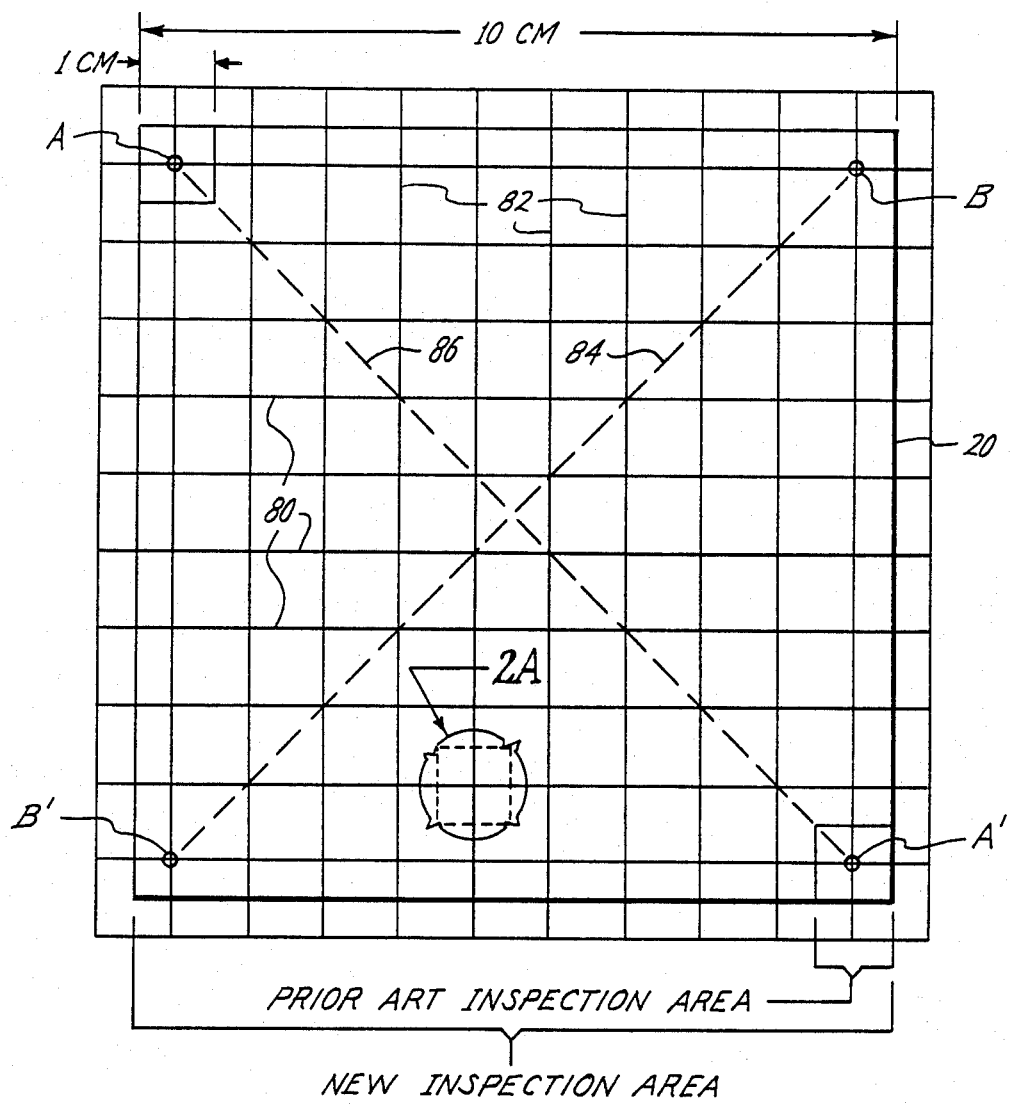
FIG. 2 is an enlarged elevational view of an electronic component having calibration lines thereon illustrating the method of calibrating the position of an electronic beam on and secondary electrons released from the electronic component.
Figure 2A:
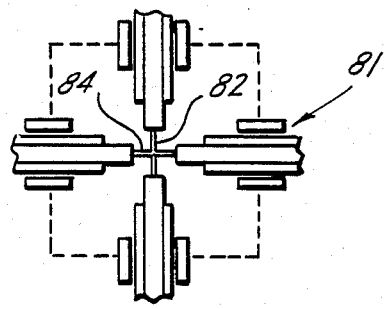
FIG. 2A is an enlarged view of the portion 2A of FIG. 2.

Referring now to FIGS. 2 and 2A, an electronic component 20 is shown having a plurality of conventional grid registration marks 80 and 82 in the X and Y directions, respectively. The grid lines 80 and 82 are conventionally used for measuring the alignment of parts on the electronic component 20 and calibrating the location of the electron beam thereon. In the simplest embodiment, the calibration is accomplished by the operator moving the mouse 40 to project the target image 81 shown on FIG. 2A on the video monitor 34. The operator can interactively measure errors and the correct the location of parts relative to intersecting grid lines 80 and 82 and to transmit the errors to the computer 36 for generating correction functions for insuring that the electron beam is correctly vectored to the desired location. This procedure can be completely automated by programming the computer to recognize the grid intersection and to measure their locations relative to the deflection system. Normally, conventional prior art electron beam measuring apparatuses have resolution limitations so that they can only measure an area of one square centimeter. Thus, assuming that the substrate 20 has a network 84 defined by end points B and B' and/or a network 86 having end points A and A', conventional prior art deviced would be unable to cover both of the end points of the networks 84 and 86 for determining, for example, whether the networks 84 and 86 had shorts or opens. However, with the secondary emission collector 60 of FIG. 3, the present apparatus can cover the entire surface of the ten centimeter square electronic circuit 20. In addition, the calibration means above described can be used to determine the correct location of the released secondary emissions for the purpose of setting the proper voltages on the various screens of the collector 60 for their optimum values for each location.

Normally, the electron beam 16 is transmitted through an aperture and deflected out of the aperture when it is desired to be blanked between changes in vectored positions of the beam 16. However, the current of the beam 16 may vary and such variations will produce inaccuracy in the test results. Referring now to FIGS. 1, 4, 4A and 4B, a combination blanking and Faraday cup is shown for measuring the current of the electron beam 16 when the beam 16 is blanked. Thus, a set of blanking plates which includes a positive plate 90 and a negative plate 92 are positioned on either side of the electron beam 16. The positive plate 90 includes an opening 94 through which the beam 16 is diverted for blanking the beam 16 from reaching the electronic component 20. A Faraday cup is connected behind the opening 94 for receiving the electron beam 16 when it is blanked. A Faraday cup is a well known configuration in which the incoming beam is directed and collected at one end of the cup. The current trapped in the cup 96 is connected to and metered by a sensitive current to voltage converter 98, transmitted to an analog to digital converter 100 and transmitted over line 102 to the computer 36 anytime the beam 16 is blanked. This structure allows a frequent check to be made upon the current of the electron beam 16 to normalize output voltage readings from the detector 26 thereby achieving better accuracy.

Another feature of the present invention is the provision of an electron beam network capacitance testing which can be used in combination with the apparatus 10 or as a separate testing apparatus. Existing capacitance testers employ a single probe which is used to contact and charge a network on the electronic component 20. Test speeds are generally limited to about ten tests per second and the self-capacitance of the probe causes errors when small low capacitance nets are probed. However, the electron beam is a high impedance, zero capacitance probe making it impossible to measure network capacitance as a by-product of the net charging operation by measuring the time required to charge a network to a predetermined voltage.

Figure 5:
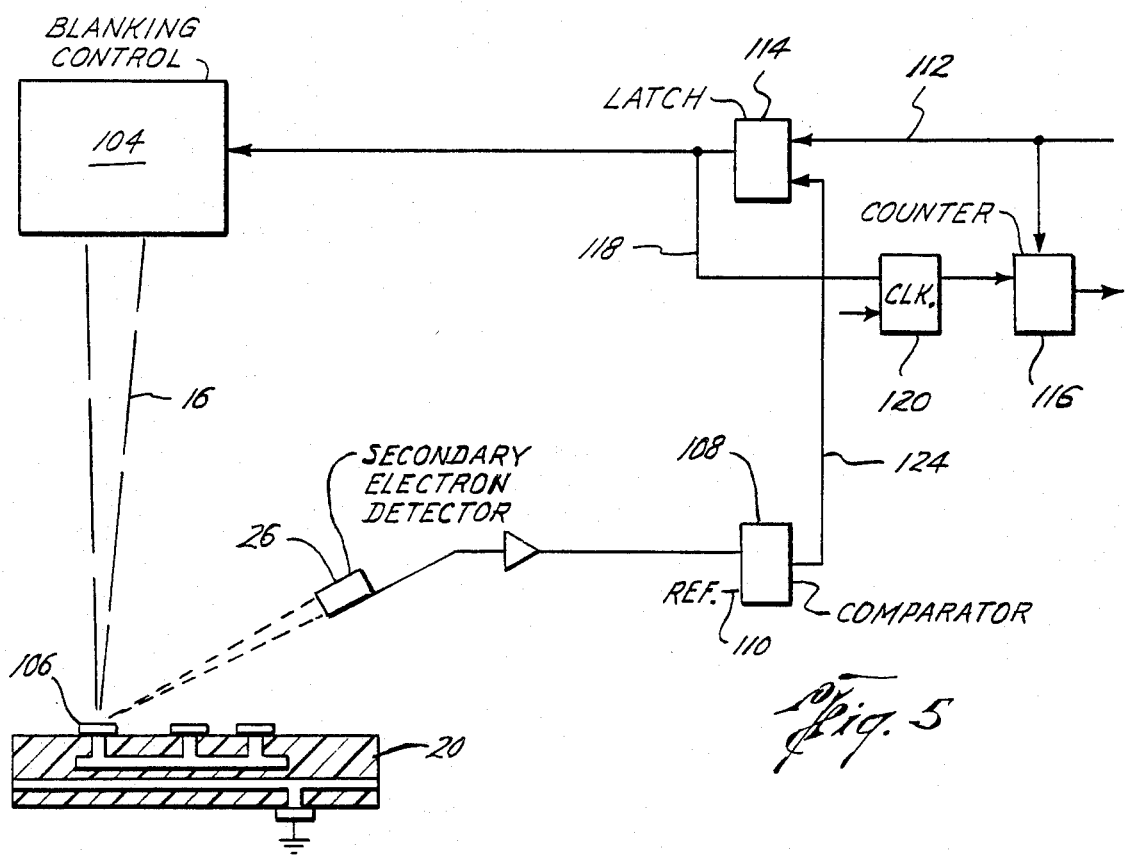
FIG. 5 is an electrical schematic of a circuit for measuring the capacitance of a network on the electronic component.
Figure 4:
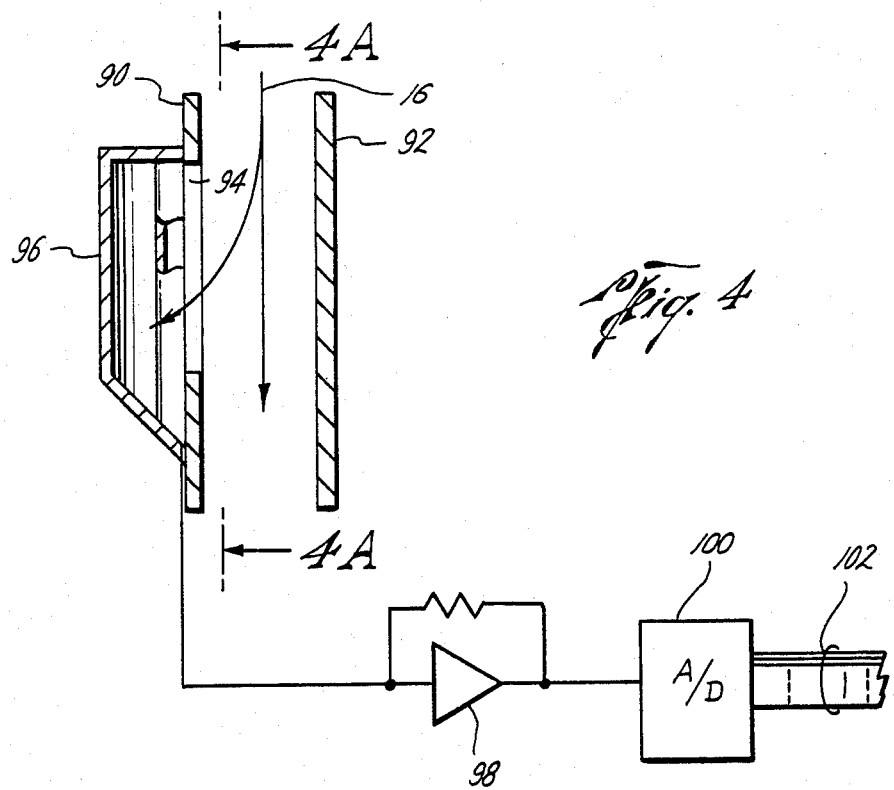
FIG. 4 is an electrical schematic illustrating the blanking and Faraday cup of the present invention for measuring beam current.
Figure 4A:
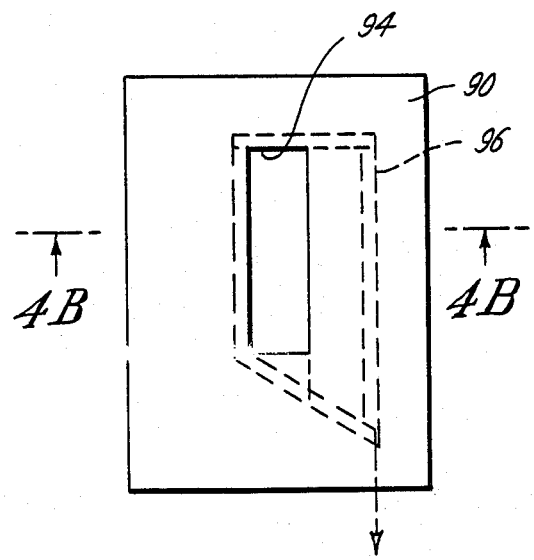
FIG. 4A is a cross-sectional view taken along the line 4A—4A of FIG. 4.
Figure 4B:
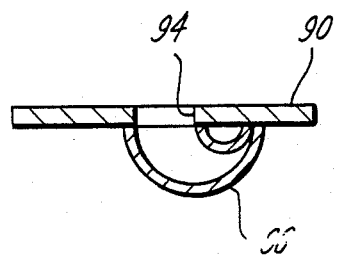
FIG. 4B is a cross-sectional view taken along the line 4B—4B of FIG. 4A.

Referring now to FIG. 5, an electrical schematic for using an electron beam for capacitance testing is shown in which the electron beam 16 passes through a blanking control 104 and is projected on a network 106 on the electronic component 20 and secondary electron emissions are detected by the detector means 26. Capacitance values for the network 106 are a direct function of the size of the network 106. Shorts to other networks will increase capacitance readings and breaks or opens in the network 106 will decrease capacitance. The output from the detector 26 is transmitted to a comparator 108 which determines when the network 106 has reached a predetermined voltage as compared to a reference voltage input 110 to the comparator 108. In order to measure the time required to charge the network 106 to the predetermined voltage as determined by the comparator 108 a circuit for measuring the timing charge is provided. For example, a "beam on" signal on line 112 is provided to a latch 114 and at the same time resets a counter 116. The latch 114 output deactivates the blanking controls 104 to direct the beam 16 onto the network 106 and simultaneously sends a singal over line 118 to a clock 120 whose output is fed into the counter 116. When the comparator 108 measures the predetermined charge an output is transmitted over the reset line 124 to reset the latch 114 which activates the blanking controls 104 and sends a signal over line 118 to stop the clock 120. By knowing the charging time, the charge voltage, and the current of the beam 16, the capacitance of the network 106 may be determined. Thus, the electron beam may provide a zero capacitance probe that may provide up to 10,000 capacitance tests per second resulting in a fast, high reliability capacitance test.

The present invention, therefore, is well adapted to carry out the objects and attain the ends and advantages mentioned as well as others inherent therein. While a presently preferred embodiment of the invention has been given for the purpose of disclosure, numerous changes in the details of construction and arrangement of parts will be readily apparent to those skilled in the art and which are encompassed within the spirit of the invention and the scope of the appended claims.

What is claimed is:

1. An electron beam testing apparatus for applying an electron beam to parts of an electronic component and measuring the secondary electrons released from said part comprising:
    means for directing an electron beam onto parts of an electronic component,
    extraction means including an extraction grid positioned above the position of the electronic component,
    retarding means including a retarding grid positioned above the extraction grid,
    a secondary electron collector positioned above the retarding grid, said collector including a plurality of vertically extending screens and having a top screen providing an enclosure above the retarding means,
    secondary electron detection means positioned adjacent one of the vertically extending screens, and
    means for applying different voltages to each of the screens of the collector for collecting secondary electrons efficiently over a large area.

2. The apparatus of claim 1 where the collector includes at least three vertically extending screens.

3. The apparatus of claim 1 wherein the collector includes six vertically extending screens.

4. The apparatus of claim 1 wherein the detection means is connected to the entire area of said one or more vertically extending screen.

5. The apparatus of claim 1 including a combination blanking and Faraday cup comprising,
    a set of blanking plates including a positive and a negative plate positioned on opposite sides of the electron beam, said positive plate having an opening for receiving the electron beam when the beam is blanked,
    a Faraday cup connected to the opening for receiving the electron beam when it is blanked and directed through the opening, and
    means connected to the Faraday cup for measuring the current of the electron beam in the Faraday cup.

6. The apparatus of claim 1 including means for measuring parameters of the capacitance of a network in electronic component including,
    means connected to the detection means for measuring the time required to charge a network to a predetermined voltage.

7. In an electron beam testing apparatus for applying an electron beam to parts of an electronic component and measuring the secondary electrons released from said part the improvement comprising,
    a set of blanking plates including a positive and a negative plate positioned on opposite sides of the electron beam,
    said positive plate having an opening for receiving the electron beam when the beam is blanked, a Faraday cup connected to the opening for receiving the electron beam when it is blanked by directing it through the opening, and means connected to the Faraday cup for measuring the current of the electron beam in the Faraday cup.

8. In an electron beam testing apparatus for applying an electron beam to part of an electronic component and measuring the secondary electrons released from said part by a detector, the improvement of means for measuring parameters of the capacitance of the part comprising:

means connected to detector for measuring when a predetermined voltage charge has been applied to the part by the electron beam, and means measuring the time to charge said part to said predetermined voltage charge.

* * * * *